United States Patent [19]

Yasuda

[11] Patent Number: 5,648,673
[45] Date of Patent: Jul. 15, 1997

[54] SEMICONDUCTOR DEVICE HAVING METAL SILICIDE FILM ON IMPURITY DIFFUSED LAYER OR CONDUCTIVE LAYER

[75] Inventor: Hiroyasu Yasuda, Tokyo, Japan

[73] Assignee: Nippon Steel Corporation, Tokyo, Japan

[21] Appl. No.: 580,460

[22] Filed: Dec. 27, 1995

[30] Foreign Application Priority Data

Dec. 28, 1994 [JP] Japan ................... 6-338738

[51] Int. Cl.$^6$ .............. H01L 29/167; H01L 29/207; H01L 29/227
[52] U.S. Cl. ............ 257/382; 257/409; 257/377; 257/412; 257/413; 257/607; 257/914
[58] Field of Search ................... 257/382, 377, 257/412, 413, 607, 914, 915, 409

[56] References Cited

U.S. PATENT DOCUMENTS

| | | | |
|---|---|---|---|
| 5,091,763 | 2/1992 | Sanchez | 257/915 |
| 5,103,272 | 4/1992 | Nishiyama | 257/915 |
| 5,268,590 | 12/1993 | Pfiester et al. | 257/915 |
| 5,508,212 | 4/1996 | Wang et al. | 437/24 |
| 5,514,902 | 5/1996 | Kawasaki et al. | 257/914 |

FOREIGN PATENT DOCUMENTS

| | | | |
|---|---|---|---|
| 64-760 | 1/1989 | Japan . | |
| 0286468 | 11/1989 | Japan | 257/915 |
| 3-234062 | 10/1991 | Japan . | |

*Primary Examiner*—Sara W. Crane
*Assistant Examiner*—David B. Hardy
*Attorney, Agent, or Firm*—Pollock, Vande Sande & Priddy

[57] ABSTRACT

A semiconductor device and a method of fabricating such a semiconductor device in which a silicon nitride film constituting a protective film for ion implantation is used for improving the device structure in order that conversion of a metal film into a silicide for reducing the resistance of a shallow-junction diffused layer may not be prevented by the knock-on phenomenon of oxygen, thereby reduce the fabrication cost. A silicon nitride film, which is used as a protective film for ion implantation into a substrate and a gate polysilicon, is processed into side walls of the gate polysilicon thereby to omit the step of forming side walls by a silicon oxide film. Further, in the case where boron is diffused into the gate polysilicon, boron diffusion is suppressed by nitrogen knock-on, thereby preventing boron from going through the gate oxide film.

6 Claims, 5 Drawing Sheets

SEMICONDUCTOR DEVICE HAVING METAL SILICIDE FILM ON IMPURITY DIFFUSED LAYER OR CONDUCTIVE LAYER

BACKGROUND OF THE INVENTION

1. Field of the Invention

The present invention relates to a semiconductor device and to a method of fabrication thereof, and more particularly to a method of fabricating a semiconductor device having a metal silicide film on a conductor or a diffused layer.

2. Description of the Related Art

To improve the degree of integration of LSI, it is necessary to reduce the depth of the junction of the impurities diffused layer in the source/drain regions. A reduced thickness of the diffused layer, however, increases the resistance value of the diffused layer and results in a reduced operating speed of the semiconductor. In view of this, semiconductor devices have conventionally been fabricated by the method described below.

First, device isolation regions are formed on a P-type silicon substrate, and a plurality of gate electrodes, each including a gate oxide film and a polycrystal silicon, are sequentially formed on the substrate. A small amount of N-type impurities are injected into the substrate, and a silicon oxide film is formed over the entire surface of the substrate. This silicon oxide film is anisotropically etched, thereby forming sidewall oxide films on the side walls of each gate electrode. Further, ion implantation of N-type impurities into the substrate with high energy forms a MOSFET of LDD (lightly doped drain) structure. After that, a metal film is formed over the entire surface of the substrate, and a metal silicide film is formed on each of the impurity diffused layers and the gate electrodes by heat treatment. The portion of the metal film that has not been converted into a silicide is then removed. These steps fabricate a MOSFET with the source/drain resistance reduced by the metal silicide film.

In carrying out ion implantation into the silicon substrate, a silicon oxide film is formed as a protective film on the substrate surface to prevent the substrate surface from roughening and the implant profile defect due to the channeling, and ions are implanted through this silicon oxide film. Ion implantation through an oxide film, however, results in introduction of oxygen into the silicon substrate due to the bombardment of the implanted ions and develops a phenomenon called "knock-on". The proportion of oxygen thus knocked on increases when impurities large in mass such as arsenic are implanted. When a metal silicide layer is formed on the impurity diffused layer formed by ion implantation, the knock-on phenomenon causes the oxygen introduced into the silicon substrate to suppress the formation of a silicide. As a result the thickness of the metal silicide layer is reduced to such an extent that it is difficult to reduce the resistance of the source/drain regions. This problem is especially conspicuous with the N-type impurity diffused layer subjected to ion-implantation of arsenic.

In manufacture of a P-type MOSFET by the above-mentioned fabrication method, boron may be implanted as impurities into a polysilicon film constituting a gate electrode. Since the diffusion coefficient of boron is high, however, boron in the gate electrode is diffused into the channel region of the substrate through the gate oxide film thereby causing variations in the threshold voltage of the MOSFET.

JP-A-64-760 discloses a fabrication method in which oxygen ions are not introduced into the silicon substrate and the silicon substrate surface is thus prevented from becoming rough. More specifically, after sidewall oxide films are formed, a silicon nitride film is formed over the entire surface of the substrate, and impurities are implanted into the substrate with high energy through the silicon nitride film, thereby forming an impurity diffused layer. In this method, nitrogen, not oxygen, is introduced into the silicon substrate and the gate electrodes by knock-on, and therefore conversion into silicide is not suppressed.

This method, however, requires the additional steps of forming a silicon nitride film over the entire surface of a silicon substrate after forming sidewall oxide films on the side walls of each gate electrode by anisotropic etching of a silicon oxide film, and also removal of the silicon nitride film used as a protective film by using hot phosphoric acid after implanting impurities with high energy. Thus, the fabrication steps of a semiconductor device become complicated. The same semiconductor device is fabricated in large quantities at a time, and therefore, a change in even a single fabrication step has a great effect on the production cost and poses a very serious problem.

SUMMARY OF THE INVENTION

Accordingly, an object of the present invention is to provide a semiconductor device and a method of fabrication thereof in which a sufficiently thick metal silicide layer having a low resistance is formed on impurity diffused layers or electrodes without complicating the fabrication steps of a semiconductor device as described above. Another object of the invention is to provide a semiconductor device and a method of fabrication thereof in which the boron diffused in the electrodes is reduced.

According to a first aspect of the invention, there is provided a semiconductor device comprising a semiconductor substrate, an insulating film patterned on the semiconductor substrate, a conductor patterned on the insulating film, an impurity diffused layer containing nitrogen and impurity and formed at least in the portions of the semiconductor substrate on both sides of the conductor, a sidewall insulating film containing a nitride film and formed on side walls of the conductor, and a metal silicide film formed at least on the impurity diffused layer.

Also, according to the first aspect of the invention, there is also provided a method of fabricating a semiconductor device, which comprises the steps of forming a first insulating film on a semiconductor substrate and patterning a conductor on the first insulating film; forming a second insulating film including a nitride film over the entire surface of the semiconductor substrate formed with the first insulating film and the conductor and then implanting impurity ions into the semiconductor substrate at least on both sides of the conductor through the second insulating film while at the same time introducing the nitrogen of the nitride film into the semiconductor substrate on the both sides of the conductor; etching the second insulating film and thereby forming a sidewall insulating film including the second insulating film on each side wall of the conductor to expose the portion of the semiconductor substrate outside of the sidewall insulating film; and forming a metal silicide film on the portion of the semiconductor substrate at least outside the sidewall insulating film.

According to a second aspect of the invention, there is provided a semiconductor device comprising a semiconductor substrate, an insulating film patterned on the semiconductor substrate, a conductor containing nitrogen and formed as a pattern on the insulating film, a sidewall insulating film including a nitride film formed on the side walls of the conductor, and a metal silicide film formed at least on the conductor.

Also, according to the second aspect of the invention, there is also provided a method of fabricating a semiconductor device, which comprises the steps of forming a first insulating film on a semiconductor substrate and patterning a conductor on the first insulating film; forming a second insulating film including a nitride film over the entire surface of the semiconductor substrate formed with the first insulating film and the conductor and implanting impurity ions into the conductor through the second insulation film while at the same time introducing the nitrogen of the nitride film into the conductor; etching the second insulating film and forming a sidewall insulating film including the second insulating film on the side walls of the conductor; and forming a metal silicide film at least on the conductor.

According to a third aspect of the invention, a method for fabricating a semiconductor device, comprises the steps of forming an insulating film on a semiconductor substrate and a conductor on the insulating film and then patterning the conductor, implanting at least boron and nitrogen into the conductor, and forming a metal silicide film at least on the conductor.

The first or second aspect of the invention provides a relatively simple semiconductor device and a simple method of fabricating the semiconductor device in which conversion to a silicide of the impurity diffused layer or the conductor is not suppressed using a nitride film as a protective film for ion implantation and using a part of the nitride film as a side wall of the conductor. According to the second or third aspect of the invention, on the other hand, there is provided a relatively simple semiconductor device and a simple method of fabricating the semiconductor device in which conversion of the conductor into a silicide is not suppressed and boron diffusion into the conductor is reduced in the case where boron is implanted as an impurity for reducing the resistance of polysilicon used as the conductor.

DESCRIPTION OF THE PREFERRED EMBODIMENTS

A first embodiment of the invention applied to a CMOS device will be explained below with reference to FIGS. 1A to 1H.

Figure 1A:
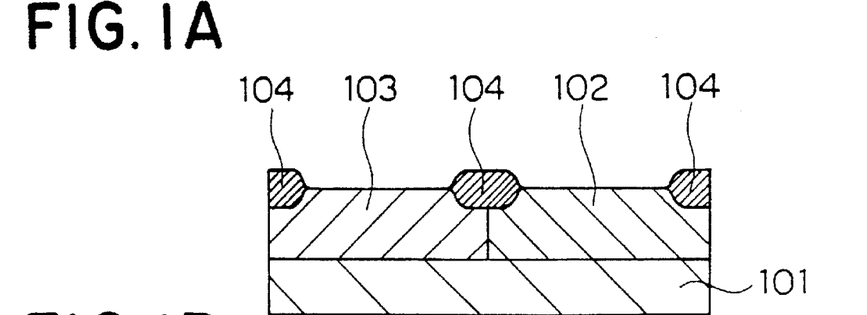
FIGS. 1A to 1H are sectional views showing a semiconductor device and the sequence of steps for fabricating it according to a first embodiment of the invention.

First, as shown in FIG. 1A, an N-well 102 and a P-well 103 are formed on a P-type silicon substrate 101, and a field oxide film 104 is formed by, for example, the local oxidation of silicon (LOCOS) method.

Figure 1B:
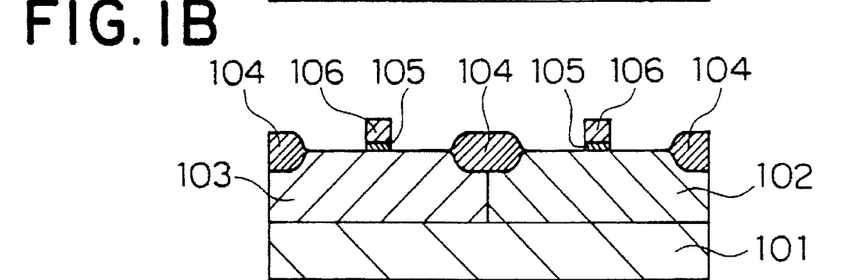

Then, as shown in FIG. 1B, a silicon oxide film 105 having about 5 to 20 nm thickness is formed on each of the N-well 102 and the P-well 103 by the thermal oxidation method, after which a non-doped polycrystal silicon film 106, 100 to 300 nm thick, is deposited by the chemical vapor deposition (CVD) method on the silicon oxide film. N-type impurities are ion-implanted into the polycrystal silicon films 106, and after a heat treatment to reduce the resistance of the polycrystal silicon film 106, a patterning is effected by the photolithography technique. Thus, a gate polysilicon film 106 is formed made up of the polycrystal silicon film 106 on each of the N-well 102 and the P-well 103 respectively. Also, the silicon oxide film 105 is removed except for the portion thereof directly under each gate polysilicon film 106.

Figure 1C:
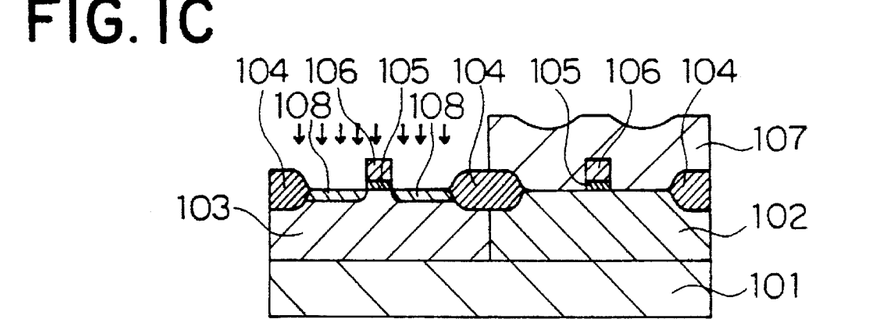

In the next step, as shown in FIG. 1C, with the N-well 102 masked by a photoresist 107, phosphorus is ion-implanted in the P-well 103 in a dosage of $2\times10^{13}/cm^2$ with an energy of 40 keV, followed by heat treatment to form the $N^-$ source/drain regions 108 of the NMOSFET.

Figure 1D:
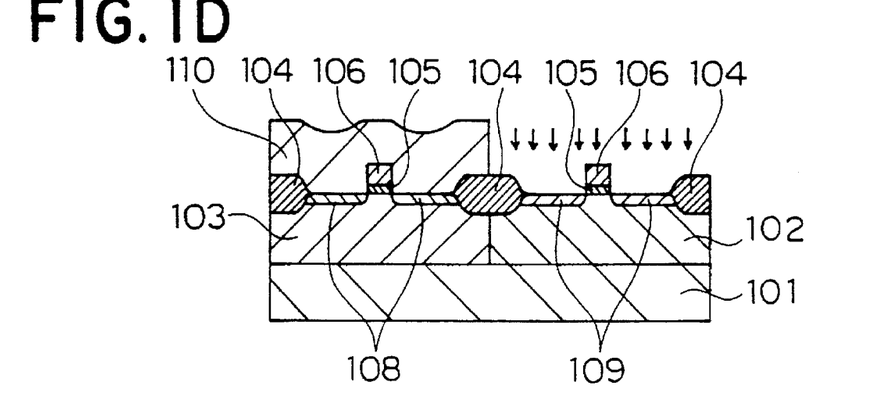

As shown in FIG. 1D, the photoresist 107 is removed, and the P-well 103 is masked by a photoresist 110. Under this condition, the N-well 103 is ion-implanted by boron in a dosage of $2\times10^{13}/cm^2$ with an energy of 15 keV in the N-well 102, so that $P^-$ source/drain regions 109 of a PMOSFET are formed by heat treatment.

Figure 1E:
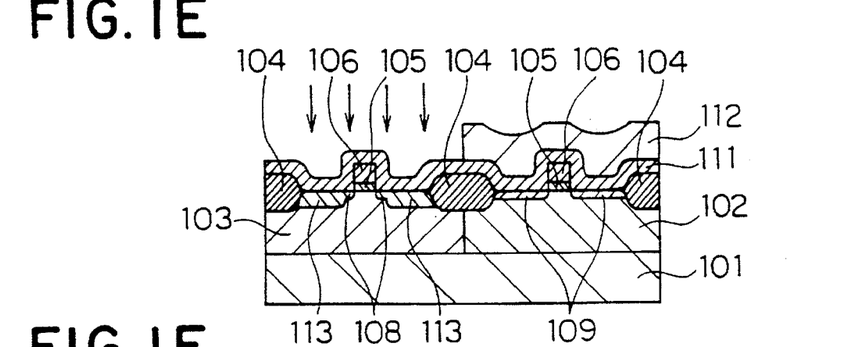

In the next step, as shown in FIG. 1E, the photoresist 110 is removed, and a silicon nitride film 111, about 100 to 300 nm thick, is formed over the entire surface of the substrate by the CVD process. In the case where the substrate surface is already oxidized naturally or similarly otherwise, the silicon nitride film 111 is formed on an oxide film. Since the oxide film is relatively thin as compared with the silicon nitride film 111, however, conversion of titanium into a silicide described later is not greatly affected. Next, with the N-well 102 masked with a photoresist 112, the P-well 103 is ion-implanted with arsenic in a dosage of about $5\times10^{14}$ to $1\times10^{16}/cm^2$ with an energy of 30 to 100 keV. In the process, arsenic ions are implanted into the P-well 103 through the silicon nitride film 111. Then, $N^+$ source/drain regions 113 of an NMOSFET are formed by heat treatment.

Figure 1F:
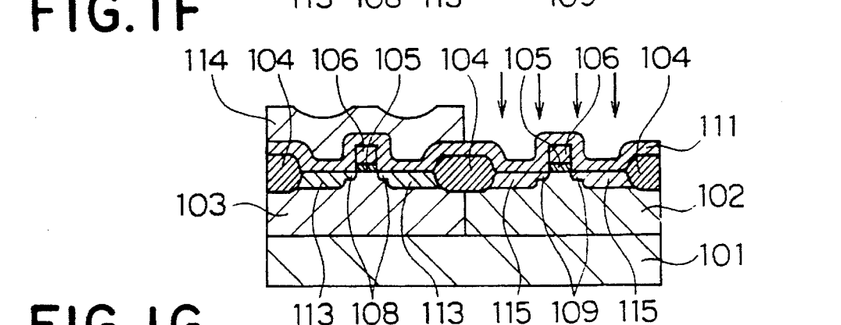

As the next step, as shown in FIG. 1F, the photoresist 112 is removed, and the P-well 103 is masked by a photoresist 114. Under this condition, the N-well 102 is ion-implanted with BF2 in a dosage of $1\times10^{14}$ to $5\times10^{16}/cm^2$ with an energy of 20 to 90 keV, followed by heat treatment for forming $P^+$ source/drain regions 115 of a PMOSFET. Also in this process, $BF_2$ is ion-implanted into the N-well 102 through the silicon nitride film 111.

Figures 1G, 1H:
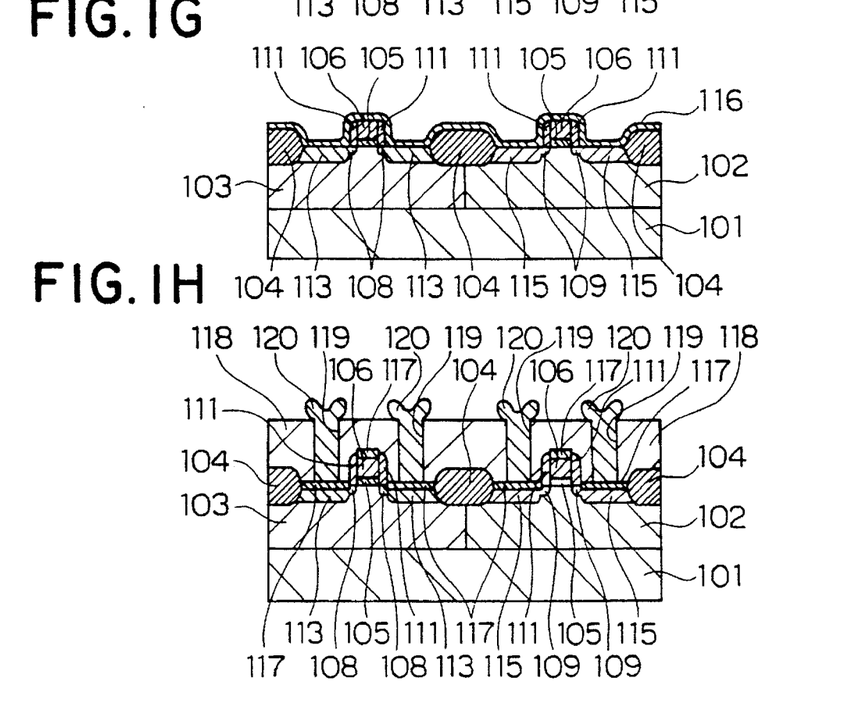

As shown in FIG. 1G, the photoresist 114 is removed, after which the silicon nitride film 111 is etched off by anisotropic etching except for the portion thereof on the side walls of each of side walls of the gate polysilicon film 106. As a result, sidewall insulating film 111 made of the silicon nitride film 111 is formed on each of side walls of the gate polysilicon film 106. After that, a titanium film 116 having the thickness of about 40 nm is deposited over the entire surface by sputtering.

Then, as shown in FIG. 1H, the substrate 101 is heat-treated for about 5 to 60 seconds at the temperature of 400° to 900° C. to form titanium silicide films 117 by self-alignment only on the gate polysilicon films 106 and the diffused layers 113 and 115. The titanium film 116 remaining without being converted into silicide and the reaction products other than silicide are removed by a mixture solution of ammonium, hydrogen peroxide and water or by a solution containing fluoric acid. Consequently, the titanium film 116 on the sidewall insulating film 111 is removed, so that the gate polysilicon film 106 and the titanium silicide films 117 on the sides thereof are insulatively isolated from each other.

As shown in FIG. 1H, a layer insulating film 118 is formed over the entire surface, and a plurality of contact holes 119 are formed in the layer insulating film 118 to form aluminum (Al) wiring layers 120.

According to the fabrication method described above, a silicon nitride film 111 is used as a protective film in forming the impurities diffused layer 113 of the N-well 102 and the impurities diffused layer 115 of the P-well 103. Therefore, the roughening of the substrate surface by ion implantation and the implantation profile defect which otherwise might be caused by channeling can be prevented, while at the same time introducing nitrogen but not oxygen into the substrate by "knock-on". Thus, conversion of the titanium into a silicide is not suppressed. Hence, a titanium silicide film 117 having sufficient thickness can be obtained on each diffused layer 113, 115, with the result that each MOSFET, even with a small junction depth of the source/drain regions, can have reduced resistance, thereby preventing decrease in operating speed of each device. The nitrogen concentration in these impurity diffused layers 113 and 115 is preferably $10^{18}$ to $10^{21}$ cm$^3$.

Further, since the silicon nitride film 111 used as a protective film for ion implantation is anisotropically etched to provide sidewall insulating films of the gate polysilicon film 106, the sidewall insulating films of a silicon oxide film is not required to be formed separately unlike in the prior art. The number of fabrication steps, therefore, need not be increased.

According to the first embodiment, a P-type well and an N-type well are formed on a silicon substrate to apply the invention to a CMOS device. In applications to usual MOS devices, however, a field oxide film and a silicon oxide film providing a gate oxide film are formed directly on a silicon substrate.

Also, although the N$^-$ region 108 and the P$^-$ region 109 are formed in the source and drain of a NMOSFET and PMOSFET respectively to produce an LDD structure in the embodiment described above, these regions may be omitted in the case where lateral diffusion of impurities due to heat treatment after ion implantation is a problem.

Further, according to the above embodiment, heat treatment is carried out after each of the ion implantation for forming the impurity diffused layer 113 and the ion implantation for forming the impurity diffused layer 115 to activate the impurities. Alternatively, heat treatment may be omitted for activating the impurities immediately after the ion implantation for forming the impurity diffused layer 113. Instead, $N_2$ annealing may be carried out at the temperature of, for example, 850° C. for 30 minutes to activate the impurities of the impurity diffused layers 113 and 115 at the same time after the ion implantation for forming the impurity diffused layer 115.

Furthermore, according to the above embodiment, in forming the gate polysilicon film 106, the non-doped polycrystal silicon film is formed over the entire surface and is ion-implanted with N-type impurities to reduce the resistance thereof, after which a gate-electrode pattern is formed. As an alternative to this method, phosphorus diffusion may be used instead of ion implantation of N-type impurities. Further, the polycrystal silicon film may be patterned into gate electrodes, and when forming the impurity diffused layers 113, 115 of the wells 102, 103, impurity ions of respective conduction type may be implanted simultaneously into the gate polysilicon film 106 through the silicon nitride film 111 to reduce the resistance of the gate polysilicon film 106. In such a case, the silicon nitride film 111 functions as a protective film at the time of ion implantation into each gate silicon film 106, and nitrogen is introduced into each gate polysilicon film 106 by knock-on. Conversion into a silicide, therefore, is not suppressed when a titanium silicide film 117 is subsequently formed on the gate polysilicon film 106. Thus, the titanium silicide film 117 having sufficient thickness is formed on the gate polysilicon film 106 to reduce the resistance of the gate electrodes. The nitrogen concentration in this gate polysilicon film (gate electrode) 106 is preferably $10^{18}$ to $10^{21}$/cm$^3$.

In forming the titanium silicide film 117, heat treatment may be carried out for 5 to 60 seconds at 600° to 1100° C. after removal of the remaining titanium film, thereby further reducing the resistance of the titanium silicide film 117. Further, a metal for forming a silicide may be molybdenum (M), tungsten (W), tantalum (Ta) or cobalt (Co) or a similar high melting point metal in place of titanium (Ti).

Generally, since boron has high diffusion coefficient, if used for forming a P-type impurity diffused layer in a silicon substrate, boron diffuses deeply into the substrate by heat treatment after ion implantation, with the result that it is difficult to produce a shallow junction. In the case where the silicon nitride film 111 is used as a protective film for ion implantation as in the above embodiment, however, nitrogen introduced into the substrate by knock-on suppresses the diffusion of boron, and therefore a shallow junction can be easily formed even if boron is used as an impurity.

The second embodiment of the invention represents an application to a device having a field shield electrode. With the recent increase in the degree of integration of semiconductor devices, the field shield isolation method is closely watched in place of the LOCOS method. The field shield isolation method is such that the voltage potential of each field shield electrode formed through a field shield insulating film in a device isolation region is set as a fixed voltage thereby to isolate devices. The second embodiment will be described with reference to FIGS. 2A to 2H.

Figure 2A:
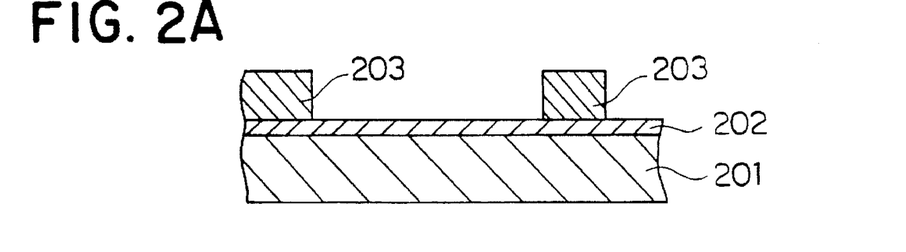
FIGS. 2A to 2H are sectional views showing a semiconductor device and the sequence of steps for fabricating it according to a second embodiment of the invention.

First, as shown in FIG. 2A, a silicon oxide film 202 is formed by thermal oxidation on a silicon substrate 201, and a non-doped polycrystal silicon film is formed thereon by the CVD method. This polycrystal silicon film is selectively etched for patterning field shield electrodes 203.

Figure 2B:
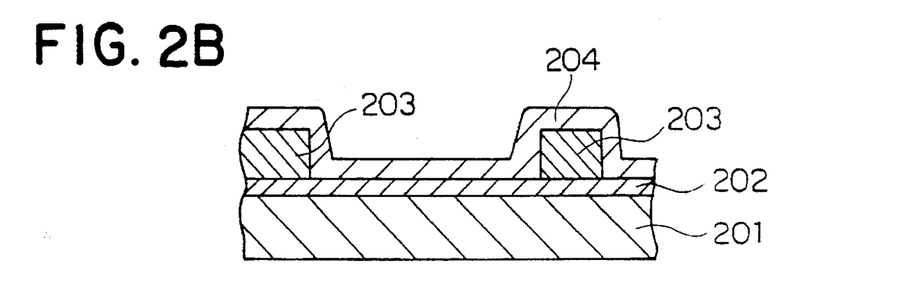

Then, as shown in FIG. 2B, a silicon oxide film 204 is formed over the entire surface of the substrate by the CVD method.

Figure 2C:
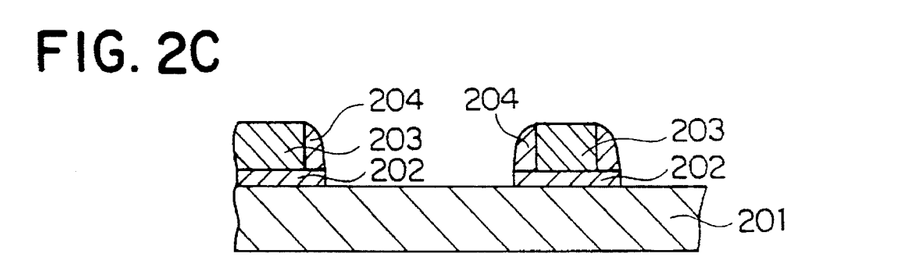

As the next step, as shown in FIG. 2C, the silicon oxide films 202 and 204 are selectively removed by the anisotropic etching according to the RIE process in a manner such as to leave the silicon oxide film 204 only on the side walls of the field shield electrodes 203. In this way, sidewall oxide films 204 are formed on the side walls of each field shield electrode 203.

Figure 2D:
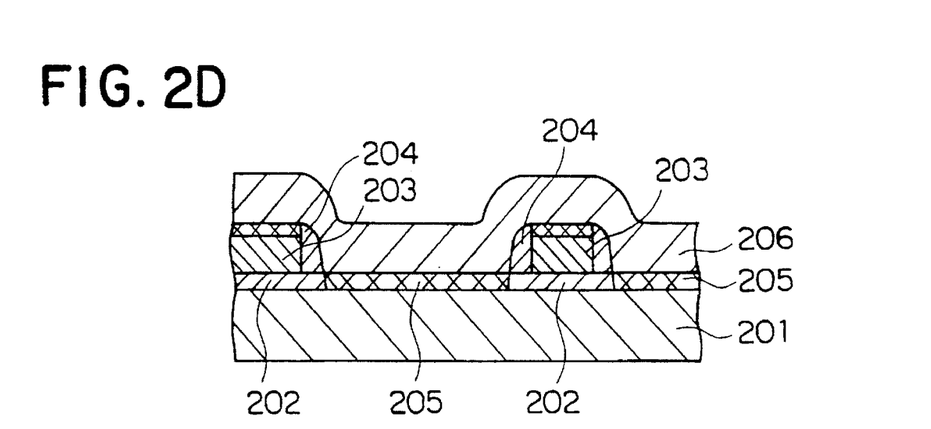
Figure 2E:
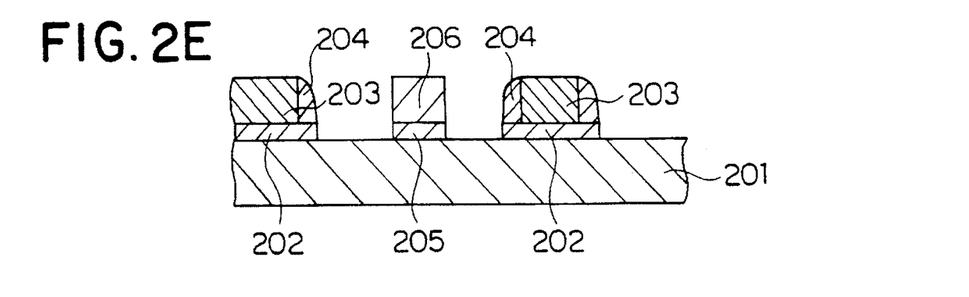

As shown in FIG. 2D, a silicon oxide film 205 is formed by thermal oxidation on the silicon substrate 201. In the process, a thermal oxidation film is formed also on the uppermost surface of the shield electrodes 203. A non-doped polycrystal silicon film 206 is formed by the CVD method over the entire surface of the substrate, after which as shown in FIG. 2E, the silicon oxide film and the polycrystal silicon film are selectively etched by the RIE or a similar method, thereby forming gate oxide films 205 and gate electrodes 206. The thermal oxidation film on the uppermost surface of the shield electrodes 203 is at the same time, also removed by etching.

Figure 2F:
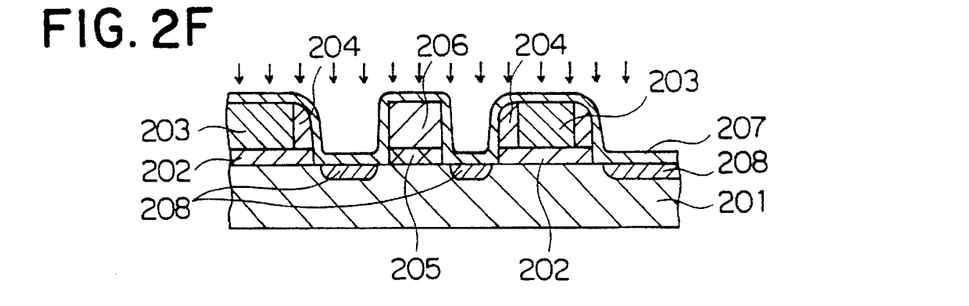

Then, as shown in FIG. 2F, a silicon nitride film 207 is formed at the thickness of about 100 to 300 nm by the CVD method over the entire surface of the substrate, and impurities ions are implanted into the silicon substrate 201, the field shield electrodes 203 and the gate electrodes 206 through the silicon nitride film 207. Thus, impurity diffused layers 208 are formed in the substrate while at the same time reducing the resistance of the field shield electrodes and the gate electrodes.

Figure 2G:
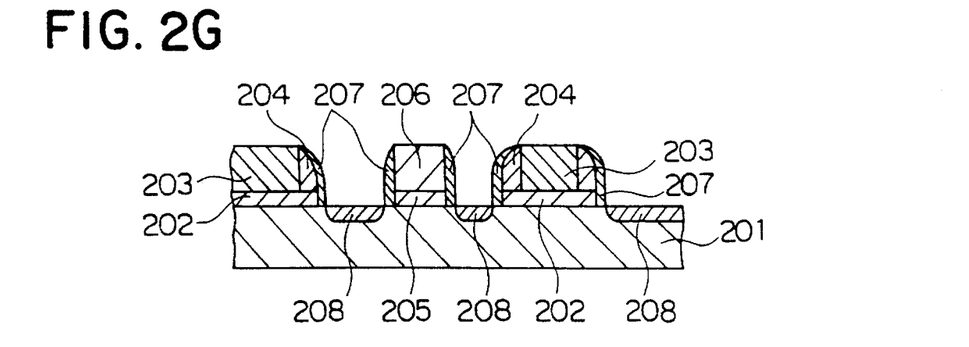

As shown in FIG. 2G, the silicon nitride films are selectively removed by anisotropic etching by the RIE method or the like, so that sidewall nitride films 207 are formed only on the side walls of the field shield electrodes 203 and the gate electrodes 206.

Figure 2H:
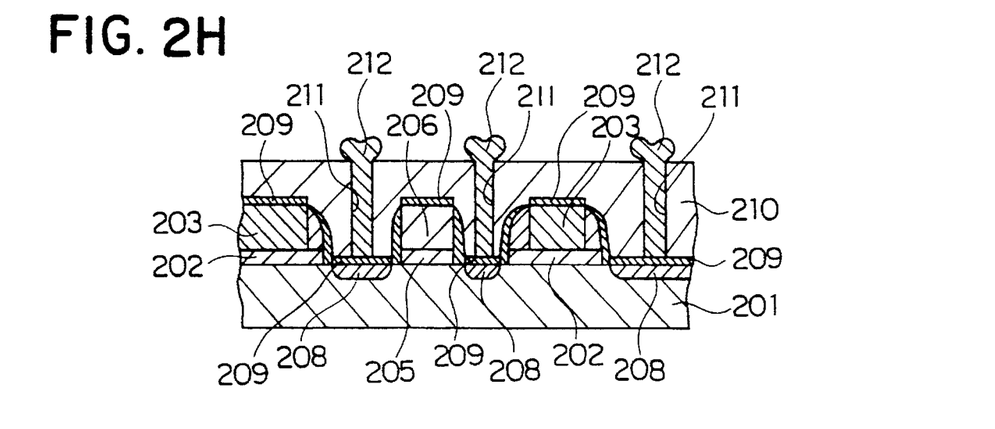

As shown in FIG. 2H, a titanium film having the thickness of about 40 nm is deposited on the entire surface of the substrate by sputtering, and then a titanium silicide film 209 is formed by self-alignment only on each of the impurity diffused layers 208, the field shield electrodes 203 and the gate electrodes 206 by the heat treatment conducted for 5 to 60 seconds at the temperature of 400° to 900° C. The titanium film not converted into a silicide and the reaction products other than the silicide are cleaned off. Further, a layer insulating film 210 is formed over the entire surface of the substrate, and contact holes 211 are formed on the layer insulating film 210 to form aluminum wiring layers 212.

In the fabrication method described above, the silicon nitride films 207 function as a protective film when impurity ions are implanted into the field shield electrodes 203, so that nitrogen is introduced into the field shield electrodes 203 by knock-on. Conversion into a silicide, therefore, is not subsequently suppressed when the titanium silicide film 209 is formed on the field shield electrodes 203. Hence, the titanium silicide film 209 of a sufficient thickness is formed on the field shield electrodes 203, the gate electrodes 206 and the impurity diffused layers 208 to reduce the resistance of these component elements.

The second embodiment may use boron for forming an impurities diffused layer, in which case the nitrogen introduced into the substrate by knock-on suppresses boron diffusion, and therefore the threshold voltage variations of the MOS transistor is decreased, thereby facilitating the forming of a shallow junction in the impurity diffusion layer.

This effect of suppressing boron diffusion is attained when nitrogen is injected directly into electrodes or the source/drain regions as well as when impurities are injected into electrodes or the source/drain regions through a nitride film. More specifically, in FIG. 2F, a similar effect is achieved by injecting boron and nitrogen directly into the silicon substrate 201, the field shield electrodes 203 and the gate electrodes 206 without forming the silicon nitride film 207, and by forming a metal silicide film on the silicon substrate 201, the field shield electrodes 203 and the gate electrodes 206 as shown in FIG. 2H while omitting the process of forming the sidewall nitride films 207 shown in FIG. 2G.

Now, a third embodiment of the invention applied to the wiring in a semiconductor device will be explained with reference to FIGS. 3A to 3D. According to this embodiment, a semiconductor device comprises a plurality of memory cells, each including a MOS transistor and a capacitor, and a peripheral circuit for driving the memory cells.

Figure 3A:
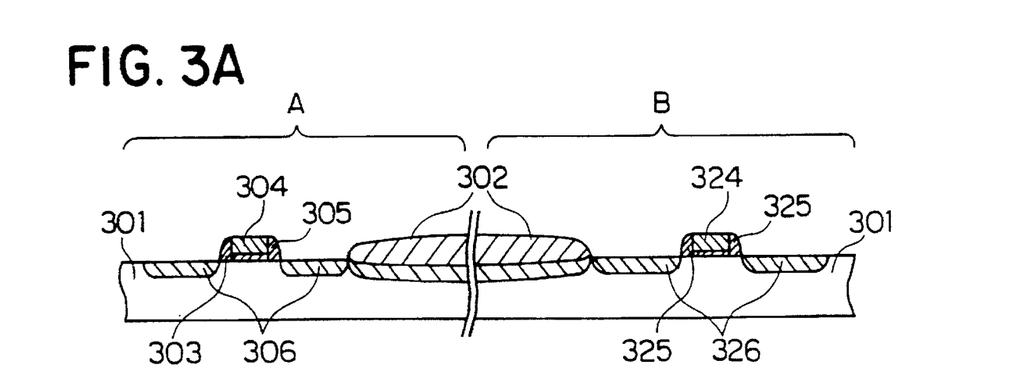
FIGS. 3A to 3D are sectional views showing a semiconductor device and the sequence of steps for fabricating it according to a third embodiment of the invention.

In FIG. 3A, reference numeral 301 designates a semiconductor substrate comprising a memory cell forming region A (left) and a peripheral circuit forming region B (right) with a device isolation region 302 inbetween. A gate oxide film 303, a gate electrode 304, sidewall insulating films 305 and impurity diffused layers 306 are formed on the left side of the semiconductor substrate 301 according to the method described in the first or second embodiment. These elements make up one of a plurality of MOS transistors arranged in matrix. In a similar fashion, a gate oxide film 323, a gate electrode 324, a sidewall insulating film 325 and impurity diffused layers 326 are formed on the right side of the semiconductor substrate 301. These elements make up one of a plurality of MOS transistors of the peripheral circuit. These two types of MOS transistors are preferably formed concurrently formed.

Figure 3B:
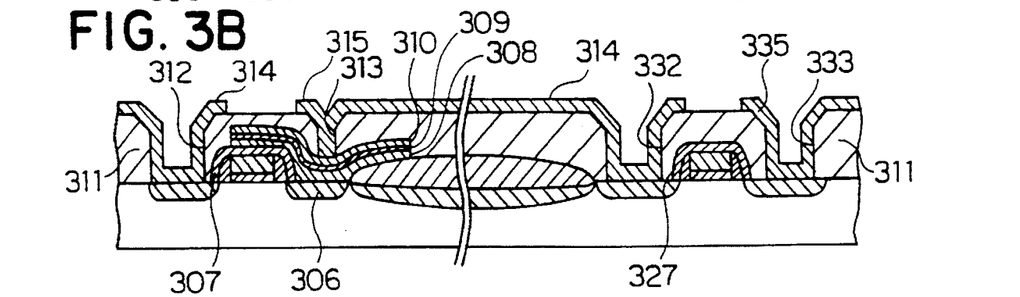

As shown in FIG. 3B, insulating films 307 and 327 are patterned on gate electrodes 304 and 324 respectively, after which a polycrystal silicon film containing impurities and constituting a lower electrode 308 of a capacitor, a dielectric film 309 and a polycrystal silicon film containing impurities and constituting an upper electrode 310 of the capacitor are sequentially formed by patterning. The lower electrode 308 of the capacitor is connected to one of the impurity diffused layers 306 of a corresponding MOS transistor in the memory cell region. After that, an insulating film 311 of BPSG (boron phosphor silicon glass) or the like is formed over the entire surface of the substrate, and contact holes 312, 313, 332, 333 are opened in the insulating film 311. Further, this step is followed by patterning a wiring (bit wire) 314 for connecting the other impurity diffused layer 306 of the MOS transistor in the memory cell region to one of the impurity diffused layers 326 of the MOS transistor in the peripheral circuit forming region and patterning a non-doped polycrystal silicon providing wirings 315 and 335.

Figure 3C:
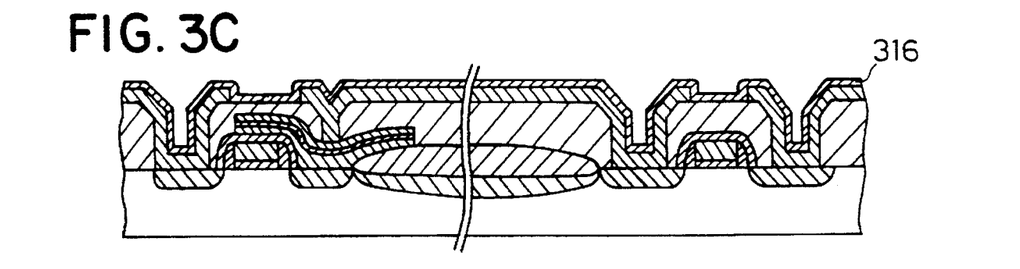

Then, as shown in FIG. 3C, a silicon nitride film 316 about 100 to 300 nm in thickness is formed over the entire surface of the substrate by the CVD method, after which impurities are implanted into the wiring layer through the silicon nitride film 316 to reduce the resistance of the wiring layer. In the process, nitrogen in the silicon nitride film 316 is also knocked on to the wiring layer. In the case where boron is used as an impurity implanted into the wiring layer, nitrogen injected into the substrate by knock-on suppresses boron diffusion in the wiring layer. It is therefore easy to form a shallow junction in the impurity diffused layers 306 and 326. Further, the insulating layer 316 is formed over the entire surface of the substrate, and a wiring 334 is connected, for example, to a power source voltage ($V_{DD}$) and a wiring 314 to a voltage of $V_{DD}/2$ through contact holes (not shown) formed in the insulating film 316. Alternatively, boron and nitrogen may be implanted into the wiring layer directly without forming the silicon nitride film 316.

Figure 3D:
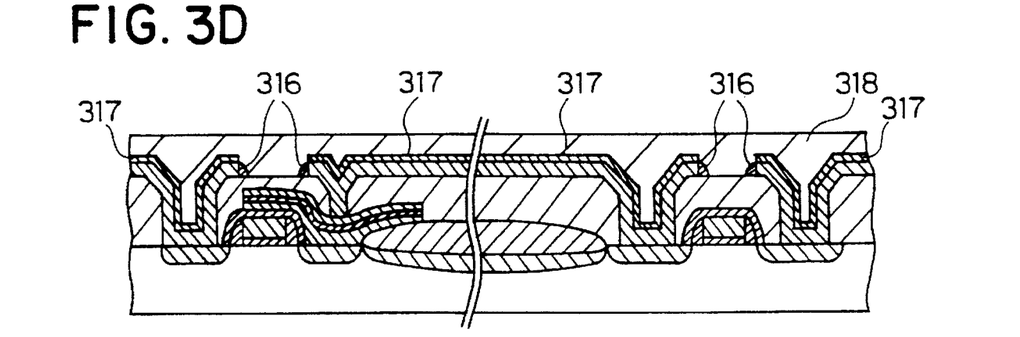

As the next step, as shown in FIG. 3D, the silicon nitride film is selectively removed and a sidewall nitride film 316 is formed only on each side wall of the wirings 314, 315, 335. This process is omitted when the silicon nitride film 316 is not formed. Furthermore, a titanium film is deposited to the thickness of about 40 nm by sputtering over the entire surface of the substrate, after which the substrate is heat treated for 5 to 60 seconds at the temperature of 400° to 900° C. Titanium silicide films 317 are thus formed by self-alignment only on the wirings 314, 315 and 335. As a result, the wirings 314, 315 and 335 can have reduced resistance. The titanium film left without being converted into a silicide and the reaction products other than silicide are cleaned off. In addition, a layer insulating film 318 is formed over the entire surface of the substrate, and the wiring 335 is connected to the power source voltage ($V_{DD}$) and the wiring 315 to a voltage of $V_{DD}/2$ through the contact holes (not shown) in the layer insulating film 318.

As described above, according to this invention, a semiconductor device comprising a metal silicide layer of sufficient thickness capable of forming a low-resistance shallow junction can be fabricated with a comparatively small number of steps for a reduced fabrication cost. Also, variations in the threshold voltage of the MOS transistor can be suppressed by suppressing the boron diffusion into a conductor even when boron is used as an impurity.

I claim:
1. A semiconductor device comprising:
   a semiconductor substrate;
   an insulating film patterned on said semiconductor substrate;
   a conductor patterned on said insulating film;
   an impurity diffused layer containing an impurity and nitrogen and formed in said semiconductor substrate at least on both sides of said conductor;
   a sidewall insulating film containing a nitride film and formed on side walls of said conductor; and
   a metal silicide film formed at least on said impurity diffused layer wherein:
   said semiconductor substrate comprises a first well region including an impurity of a first conductivity type and a second well region including an impurity of a second conductivity type each respectively formed therein;
   said insulating film includes a first and a second insulating film formed on said first and second well regions, respectively;
   said conductor includes first and second gate electrodes formed on said first and second gate insulating films respectively; and
   said impurity diffused layer includes a first impurity diffused layer containing nitrogen and an impurity of the second conductivity type and formed in portions of said first well region on both sides of said first gate electrode and a second impurity diffused layer containing nitrogen and an impurity of the first conductivity type and formed in portions of said second well region on both sides of said second gate electrode.

2. A semiconductor device according to claim 1, wherein said conductor is a field shield electrode.

3. A semiconductor device according to claim 1, wherein thickness of said nitride film is 100 to 300 nm.

4. A semiconductor device according to claim 1, wherein:
   said semiconductor substrate is a silicon substrate; and
   said nitride film is a silicon nitride film.

5. A semiconductor device according to claim 1, wherein said metal silicide film contains selected one of titanium, molybdenum, tungsten, tantalum and cobalt.

6. A semiconductor device according to claim 1, wherein said impurity diffused layer contains nitrogen of $10^{18}$ to $10^{21}$/cm$^3$.

* * * * *